United States Patent
He

(10) Patent No.: US 7,448,437 B2
(45) Date of Patent: Nov. 11, 2008

(54) HEAT DISSIPATING DEVICE WITH HEAT RESERVOIR

(75) Inventor: Li He, Shenzhen (CN)

(73) Assignees: Fu Zhun Precision Industry (Shenzhen) Co., Ltd., Bao'an District, Shenzhen, Guangdong Province (CN); Foxxconn Technology Co., Ltd., Tu-Cheng, Taipei Hsien (TW)

( * ) Notice: Subject to any disclaimer, the term of this patent is extended or adjusted under 35 U.S.C. 154(b) by 140 days.

(21) Appl. No.: 11/166,951

(22) Filed: Jun. 24, 2005

(65) Prior Publication Data

US 2006/0289149 A1 Dec. 28, 2006

(51) Int. Cl.
*F28D 15/00* (2006.01)
*H05K 7/20* (2006.01)

(52) U.S. Cl. ............. 165/80.4; 165/104.21; 165/104.33

(58) Field of Classification Search ................ 165/80.4, 165/185, 80.3, 104.21, 104.31, 104.33, 104.34; 361/695–700; 257/714, 715
See application file for complete search history.

(56) References Cited

U.S. PATENT DOCUMENTS

| | | | |
|---|---|---|---|
| 3,750,745 A * | 8/1973 | Moore, Jr. ............... | 165/104.26 |
| 5,353,863 A * | 10/1994 | Yu ............................. | 165/80.3 |
| 5,549,155 A * | 8/1996 | Meyer et al. ........... | 165/104.33 |
| 5,946,918 A | 9/1999 | Greene | |
| 6,131,393 A | 10/2000 | Greene | |
| 6,226,178 B1 | 5/2001 | Broder et al. | |
| 6,260,613 B1 | 7/2001 | Pollard, II | |
| 6,631,755 B1 * | 10/2003 | Kung et al. .................... | 165/46 |
| 6,666,260 B2 * | 12/2003 | Tantoush .................... | 165/80.3 |
| 6,997,241 B2 * | 2/2006 | Chou et al. ................. | 165/80.3 |
| 7,028,757 B1 * | 4/2006 | Hegde .................... | 165/104.21 |
| 7,147,043 B2 * | 12/2006 | Lee et al. ............... | 165/104.21 |
| 2004/0226697 A1 * | 11/2004 | Liu ........................ | 165/104.33 |
| 2005/0078447 A1 * | 4/2005 | Hamann et al. ............. | 361/689 |
| 2005/0092465 A1 * | 5/2005 | Lin et al. ................. | 165/104.21 |
| 2005/0141198 A1 * | 6/2005 | Lee et al. ..................... | 361/700 |
| 2005/0207120 A1 * | 9/2005 | Tseng et al. ................ | 361/700 |

* cited by examiner

*Primary Examiner*—Tho v Duong
(74) *Attorney, Agent, or Firm*—Morris Manning Martin LLP; Tim Tingkang Xia, Esq.

(57) ABSTRACT

A heat dissipating device includes a heat sink (10), a heat pipe (20), a heat reservoir (30) thermally connecting with the heat sink through the heat pipe, and a fan (40) generating an airflow through the heat sink. The heat pipe includes an evaporating portion (202) attached to the heat sink and a condensing portion (204) attached to the heat reservoir. The heat reservoir is made of metal containing working medium, such as water, therein. The heat reservoir stores or releases heat based on the amount of heat generated by the CPU to realize a compensation to the increase or decrease of temperature of the CPU, whereby the change rate of the temperature of the CPU from idle to busy condition and vice versa can be more stable.

14 Claims, 4 Drawing Sheets

HEAT DISSIPATING DEVICE WITH HEAT RESERVOIR

BACKGROUND

1. Field

The present invention relates to a heat dissipating device to dissipate heat generated by an electrical component in a computer system, and more particularly to a heat dissipating device which has a heat reservoir for storing heat received from the electronic component such as a Central Processing Unit (CPU).

2. Prior Art

As computer technology continues to advance, electronic components such as central processing units (CPUs) of computers are made to provide faster operational speeds and greater functional capabilities. When a CPU operates at a high speed in a computer, its temperature frequently increases greatly. Cooling is especially important for the CPU of the computer. Without proper cooling, the heat generated by the CPU can quickly cause the CPU to overheat and damage the CPU. It is desirable to dissipate the heat quickly, for example using a heat sink system assembled within the computer, so that the CPU of the computer operates in normal temperature range.

A conventional heat sink system mounted on CPUs includes a heat sink and a cooling fan.

Currently, the rotational speed of the cooling fan is controlled by BIOS (Basic Input Output System) according to the CPU temperature. Higher the CPU temperature, faster the speed of the cooling fan runs. When a computer system is busy, the CPU operates at high speed and large amounts of heat is generated by the CPU; the speed of the cooling fan is raised rapidly according to commands from the BIOS in order to timely dissipate the heat, whereby noise of the fan is raised simultaneously. When a computer system is idle, the heat generated by the CPU is reduced enormously, the temperature of the CUP drops very quickly and the speed of the cooling fan is decreased abruptly according to the commands from the BIOS. The sudden change of the temperature of the CPU is harmful to the lifespan of the CPU. The abrupt variation of the speed of the fan according to the change of temperature of the CPU leads the fan to generate a suddenly varied noise level which is very annoying to a user of the computer.

Consequently, there is a need in the art to maintain the CPU temperature within a slightly changed range and to stabilize the cooling fan speed when the cooling fan operates.

SUMMARY

Accordingly, what is needed is a heat dissipating device which has a substantially uniform heat dissipation effect.

A heat dissipating device in accordance with the present invention comprises a heat sink, at least one U-shaped heat pipe, a heat reservoir for mounting on the heat sink, a fan mounted horizontally to the heat sink and a pair of clips. The heat sink comprises a heat spreader and a plurality of fins attached on the heat spreader. The heat pipe comprises an evaporating portion attached to the heat spreader and a condensing portion parallel to the evaporating portion. The heat reservoir is made of a material with a high thermal conductivity, and has a sealed chamber containing working medium having higher specific heat, such as water. When the heat generated by the CPU is increased rapidly, the heat reservoir may absorb the heat to drop the temperature of the CPU in a short time. The heat absorbed by the heat reservoir is reserved in the heat reservoir. When the heat generated by the CPU is decreased sharply, the heat reserved in the heat reservoir is released to prevent the temperature of the CPU from being great lowered. Thus, the heat reservoir may reserve or release heat based on the amount of heat generated by the CPU to realize a substantially uniform heat dissipation effect and to maintain the temperature of the CPU at a slightly changed range.

Other advantages and novel features of the present invention will become more apparent from the following detailed description when taken in conjunction with the accompanying drawings, in which:

DETAILED DESCRIPTION OF THE PREFERRED EMBODIMENTS

Figure 1:
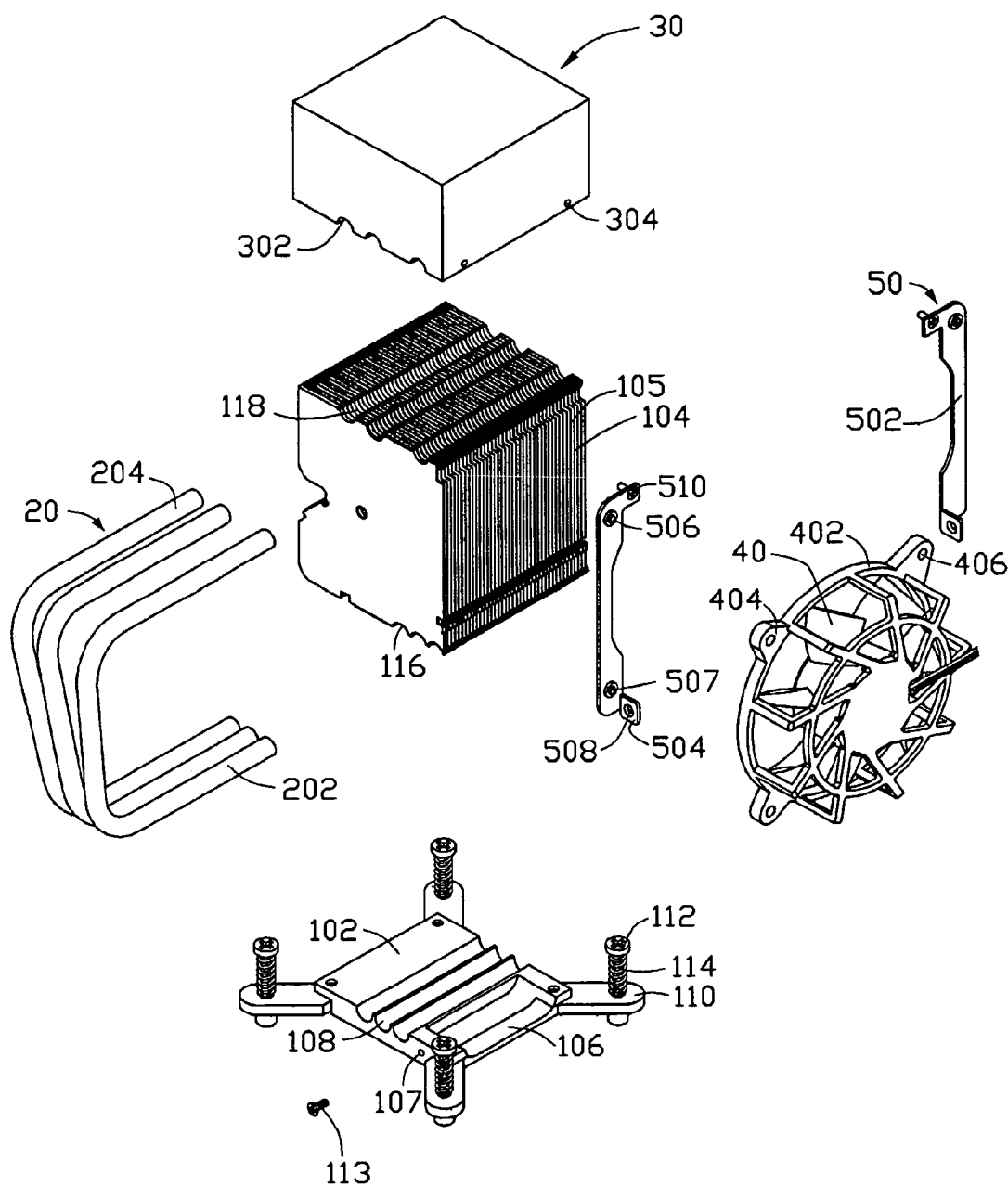
FIG. 1 is an exploded, isometric view of a heat dissipating device in accordance with a first preferred embodiment of the present invention.
Figure 2:
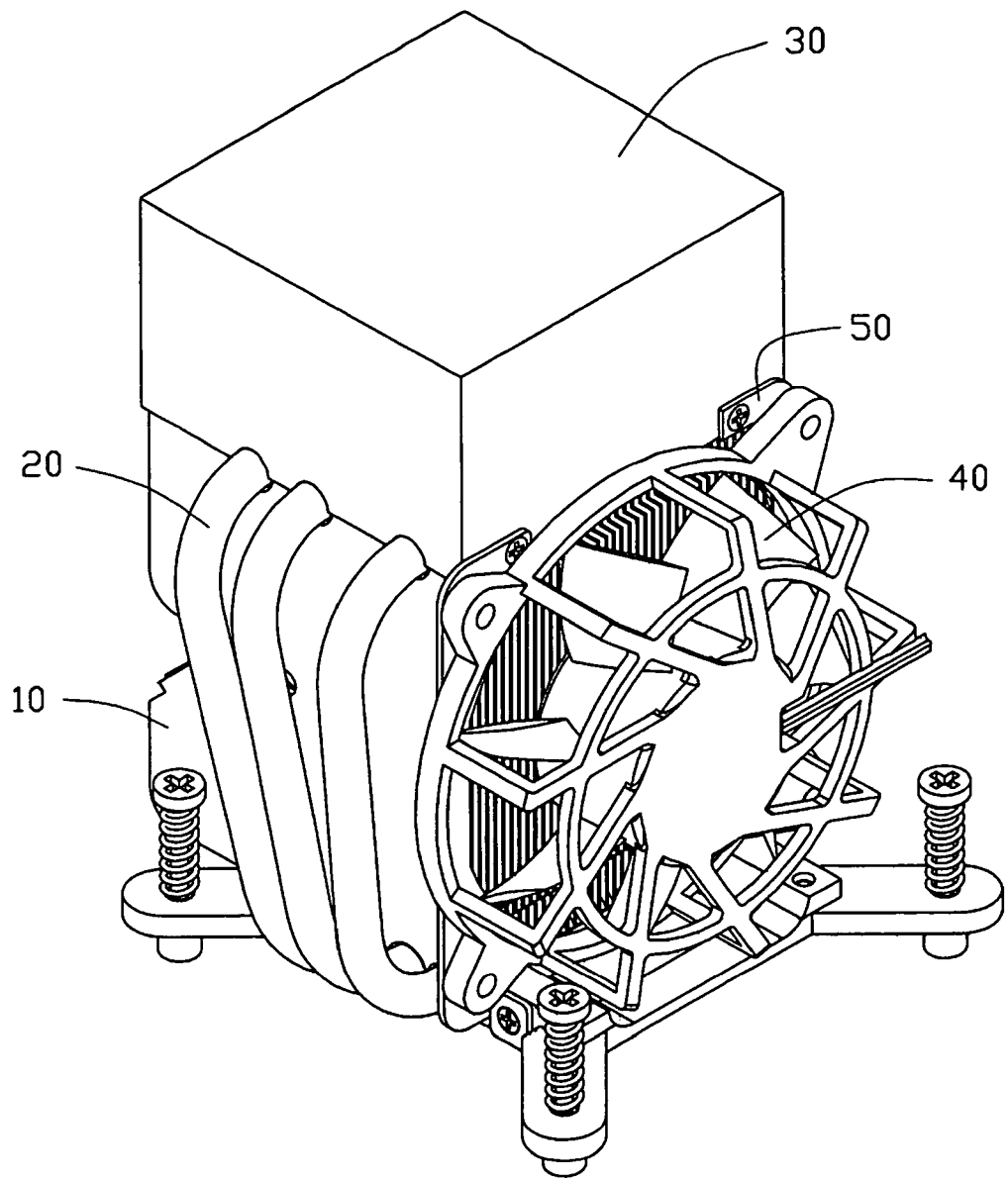
FIG. 2 is an assembled view of FIG. 1.

FIGS. 1-2 show a heat dissipating device in accordance with a first preferred embodiment of the present invention. The heat dissipating device comprises a heat sink 10, three heat pipes 20, a heat reservoir 30 mounted on the heat sink 10, a fan 40 mounted to a side of the heat sink 10 and a pair of clips 50.

The heat sink 10 comprises a heat spreader 102 and a plurality of fins 104. The heat spreader 102 is preferably made of copper or aluminum material, and has a bottom mating surface for contacting a heat source such as a CPU (not shown). The heat spreader 102 defines a recess 106 for partially receiving the fan 40 and three parallel adjoining grooves 108 in a top surface thereof, opposing the mating surface. The heat spreader 102 defines mounting holes 107 at two lateral sides, near the recess 106. The heat spreader 102 forms ears 110 extending outwardly at four corners thereof. The heat spreader 102 is attached on the CPU by screws 112 extending through the ears 110 and engaging with a retainer (not shown) surrounding the CPU. Each screw 112 is provided with a spring 114 therearound, for ensuring a secure engagement between the screws 112 and the retainer. The fins 104 are attached on the spreader 102. The fins 104 define three adjoining slots 116 in a bottom portion thereof corresponding to the grooves 108 of the heat spreader 102, and three spaced slots 118 in a top portion thereof. The grooves 108 and the slots 116, 118 each have a semicircle cross-section.

Each heat pipe 20 is generally U-shaped, and forms a capillary structure therein. Opposite ends of each heat pipe 20 respectively form an evaporating portion 202 and a condensing portion 204 parallel to the evaporating portion 202. The evaporating portions 202 of the heat pipes 20 are fixedly received in holes formed by the corresponding grooves 108 of the heat spreader 102 and slots 116 of the fins 104 by soldering means or by other conventional means such that the heat pipes 20 and the heat sink 10 (inclusive of the fins 104 and the heat spreader 102) are thermally connected together.

The heat reservoir 30 is a block made of a material with a high thermal conductivity, such as copper, and has a sealed chamber therein containing working medium having a high specific heat, such as water. The heat reservoir 30 has a square configuration. Three slots 302 corresponding to the slots 118 of the fins 104 is defined in a bottom portion of the heat reservoir 30. The condensing portions 204 of the heat pipes 20 are fixedly received in holes formed by the slots 302 of the heat reservoir 30 and the slots 118 of the fins 104 such that the fins 104, the heat pipes 20 and the heat reservoir 30 are thermally connected together, which means that heat received by the spreader 102 is transferred to the heat reservoir 30 and the fins 104 by the heat pipes 20. When the CPU operates, heat is generated by the CPU and transferred to the heat sink 10, the raised temperature of the heat sink 10 can be calculated by following equation:

$$\Delta t = Q/(m1 \times C1 + m2 \times C2)$$

where
$\Delta t$ is the raised temperature of the heat sink 10;
Q is the amount heat of the CPU operating;
m1 is the mass of the heat sink 10;
m2 is the mass of the water in the heat reservoir 30;
C1 is the specific heat of the heat sink 10;
C2 is the specific heat of the water in the heat reservoir 30.

In a comparison between the prior art and the present invention, suppose that the amount heat generated by the CPU is a constant value, the specific heat of the heat sink in the prior art is the same as C1 of the present invention, and the mass of the heat sink in the prior art is a combination of m1 and m2 of the present invention. The heat sink 30 is made of copper, the specific heat of water is bigger than the specific heat of copper, which means C2 is bigger than C1, so the increased or decreased speed of the temperature of the heat sink 10 with the heat reservoir 30 is much lower than the heat sink without the heat reservoir in the prior art when they are used to absorb or dissipate a determined amount of heat. Because the heat sink 10 and the heat reservoir 30 are thermally connected with the CPU, the large degree of fluctuation of the temperature of the CPU between busy and idle conditions can be improved. Thus, the speed of the fan does not need to be varied abruptly due to the sudden increase or decrease of the temperature of the CPU.

When the CPU is busy and the heat generated by the CPU is increased, the heat reservoir 30 can absorb the heat and store the heat therein to drop the temperature of the CPU to an acceptable level. When the CPU is shifted to idle and the heat generated by the CPU is decreased sharply, the heat reservoir 30 can release the heat stored therein to prevent the temperature of the CPU from being lowered too quickly. Thus the temperature of the CPU can have a more stable variation.

The fan 40 is contained in a bracket 402 having a generally circular configuration, and is mounted to a lateral side 105 of the fins 104 via the clips 50. The fan 40 is used for producing forced airflow to flow through channels (not labeled) between the fins 104 to thereby promote heat dissipation efficiency of the heat sink 10. The bracket 402 forms four lugs 404 extending outwardly therefrom. An aperture 406 is defined in each lug 404. The rotational speed of the fan 40 is controlled by BIOS based on the temperature of the CPU.

Each clip 50 comprises a body 502 positioned on the lateral side 105 of the fins 104, and a tab 504 perpendicularly extending from a bottom side of the body 502. An engaging screw 510 extends through a top end of the body 502 for engaging in a corresponding mounting hole 304. Each body 502 forms a pair of bulges 506. A screw hole 507 is defined in each bulge 506. Each tab 504 defines a locating hole 508 corresponding to one the mounting holes 107 of the heat spreader 102. In this embodiment, the clips 50 are fastened on the heat sink 10 by engaging screws 113 through the locating holes 508 of the clips 50 and into the mounting holes 107 of the heat spreader 102, and by engaging the screws 510 into the mounting holes 304 of the heat reservoir 30. The lugs 404 of the bracket 402 are fastened to the clips 50 by extending screws (not shown) through the apertures 406 of the lugs 404 into the screw holes 507 defined in the bulges 506 of the clips 50. Thus, the fan 40 is secured on the lateral side 105 of the heat sink 10 and the heat reservoir 30 and blows air flow through the channels of fins 104 to enhance heat dissipating effectiveness of the heat sink 10.

In operation of the heat dissipating device, one portion of heat accumulated on the heat spreader 10 can be immediately taken away to the fins 104 of the heat sink 10 where the heat is dissipated to atmosphere. The other portion of the heat accumulated on the heat spreader 10 is transferred to the heat reservoir 30 via the heat pipes 20. The heat on the heat reservoir 30 is absorbed by the working medium in the heat reservoir 30 and is reserved in the heat reservoir 30. When the heat generated by the CPU is decreased sharply, the heat can be quickly dissipated by the heat sink, the heat reserved in the heat reservoir 30 is released to prevent the temperature of the CPU from being dropped too quickly. When the heat generated by the CPU is increased rapidly, the heat reservoir 30 may absorb the heat and the fins 104 can dissipate the heat to lower the temperature of the CPU to an acceptable level. Thus, the heat reservoir 30 may store or release heat based on the amount of heat generated by the CPU to realize a compensation to the quick increase or decrease of the temperature of the CPU due to shift between idle and busy conditions, thereby maintaining the temperature of the CPU to have a stable change rate within a predetermined range. Thus, change of the rotation speed of the fan 40 is maintained at a stable rate within a predetermined range since the change of the speed of the fan is proportional to the change of the temperature of the CPU. Accordingly, an abrupt fluctuation of the noise level generated by the operation of the fan 40 can be avoided.

Figure 3:
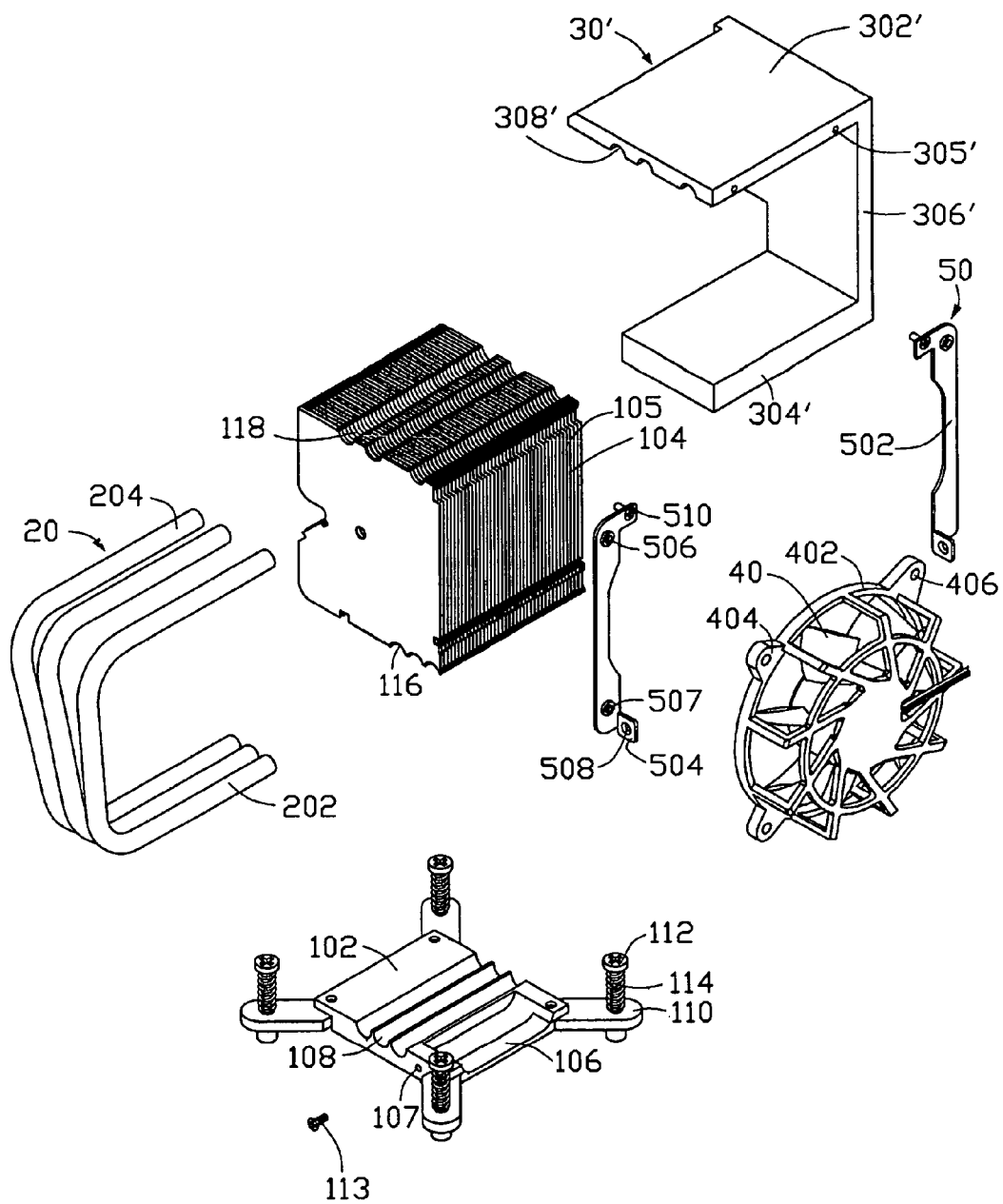
FIG. 3 is an exploded, isometric view of a heat dissipating device in accordance with a second preferred embodiment of the present invention.
Figure 4:
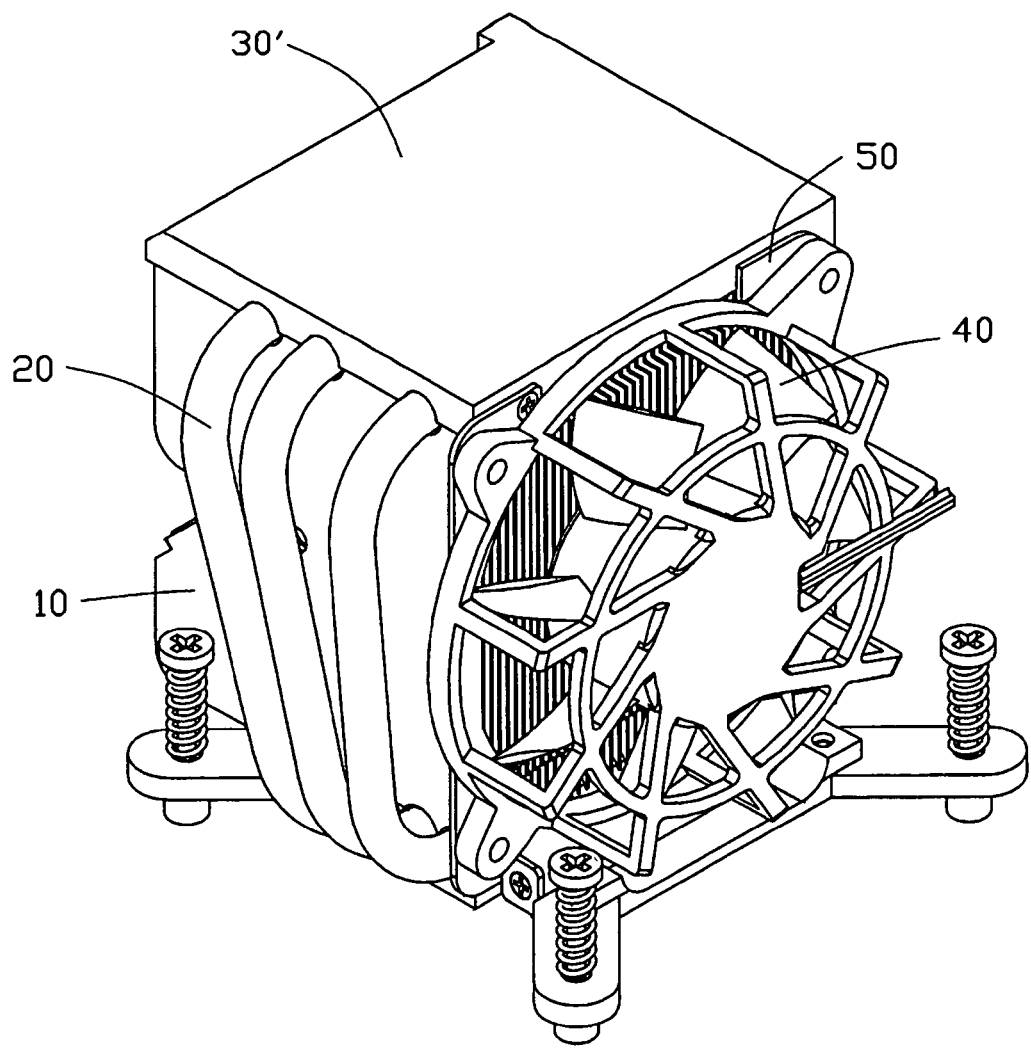
FIG. 4 is an assembled view of FIG. 3.

FIGS. 3-4 show a heat dissipating device in accordance with a second preferred embodiment of the present invention. The heat dissipating device of the second preferred embodiment is similar with that of the first preferred embodiment. However, a heat reservoir 30' replaces the heat reservoir 30 of the first embodiment. The heat reservoir 30' has a U-shaped configuration, and comprises an upper portion 302', a lower portion 304' and a middle portion 306'. The upper portion 302' of the heat reservoir 30' is parallel to the lower portion 304', and is connected to the lower portion 304' via the middle portion 306'. The upper portion 302' defines three slots 308' in a bottom portion thereof, corresponding to the slots 118 of the fins 104. A pair of mounting holes 305' is defined in a lateral side of the upper portion 302'. In the second preferred embodiment, the heat sink 10 is sandwiched between the upper portion 302' and the lower portion 304'. The lower portion 304' is attached to the CPU.

In operation of the heat dissipating device in accordance with the second embodiment, one portion of heat accumulated on the lower portion 304' is conducted to the heat spreader 102, and is subsequently transferred to the fins 104 for being dissipated to atmosphere. The other portion of the heat accumulated on the lower portion 304' is absorbed by the working medium in the lower portion 304' and is stored in the lower portion 304'. The heat pipes 20 transfer one portion of the absorbed heat from the heat spreader 102 to the upper portion 302' of the heat reservoir 30'. The heat on the upper portion 302' is absorbed by the working medium in the upper portion 302' and is stored in the upper portion 302'. When the heat generated by the CPU is decreased sharply, the heat stored in the heat reservoir 30' can be released to prevent the temperature of the CPU from being quickly dropped. When the heat generated by the CPU is increased rapidly, the heat reservoir 30' may absorb the heat to lower the temperature of the CPU to an acceptable level. Thus, the heat reservoir 30' may store or release heat based on the amount of heat generated by the CPU to realize a compensation to the quick increase or decrease of the temperature of the CPU, thereby maintaining the temperature of the CPU to have a stable change rate. Therefore, the change of the rotation speed of the fan 40 is maintained at a stable rate, and the abrupt fluctuation of the noise level generated by the operation of the fan 40 is prevented.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat dissipating device comprising:
    a heat sink comprising a heat spreader and a plurality of fins attached on the heat spreader;
    a heat reservoir mounting on the heat sink, and having a sealed chamber containing working medium therein;
    a heat pipe thermally connecting with the heat spreader and the heat reservoir; and
    a fan and a pair of clips mounting the fan to a lateral side of the heat sink and the heat reservoir;
    wherein each clip comprises a body being positioned on the heat reservoir, and a tab perpendicularly extending from the body and being positioned on the heat spreader.

2. The heat dissipating device of claim 1, wherein the working medium comprises water.

3. The heat dissipating device of claim 1, wherein the heat reservoir defines a slot receiving the heat pipe.

4. The heat dissipating device of claim 1, wherein the heat pipe comprises a first end thermally engaged with the heat spreader and the fins, and a second end thermally engaged with the fins and the heat reservoir.

5. The heat dissipating device of claim 1, wherein the heat reservoir comprises an upper portion and a lower portion connected to the upper portion via a middle portion.

6. The heat dissipating device of claim 5, wherein the heat reservoir is U-shaped, and the upper portion is parallel to the lower portion.

7. The heat dissipating device of claim 5, wherein the heat sink is sandwiched between the upper portion and the lower portion of the heat reservoir.

8. The heat dissipating device of claim 5, wherein the upper portion defines a slot receiving the heat pipe.

9. A heat dissipating device comprising:
    a heat sink comprises a heat spreader and a plurality of fins attached on the heat spreader;
    a heat reservoir mounting on the heat sink, and having a sealed chamber for containing working medium;
    a pair of clips secured to a lateral side of the heat sink and the heat reservoir;
    a fan mounted onto the heat sink via the clips; and
    a heat pipe transferring heat from the heat spreader to the heat reservoir;
    wherein the heat reservoir comprises an upper portion and a lower portion parallel to the upper portion; and
    wherein the heat sink is sandwiched between the upper portion and the lower portion.

10. The heat dissipating device of claim 9, wherein the heat pipe comprises a first end thermally engaged with the heat spreader and the fins, and a second end thermally engaged with the fins and the heat reservoir.

11. The heat dissipating device of claim 9, wherein each clip comprises a body having a top end fastened to the heat reservoir, and a lower end fastened on the heat spreader.

12. The heat dissipating device of claim 9, wherein the fan is contained in a bracket which has four lugs being mounted to the clips.

13. A heat dissipating device comprising:
    a heat sink comprising a heat spreader and a plurality of fins attached on the heat spreader;
    a heat reservoir mounting on the heat sink, and having a sealed chamber containing working medium therein; and
    a heat pipe thermally connecting with the heat spreader and the heat reservoir;
    wherein the heat reservoir comprises an upper portion and a lower portion connected with the upper portion via a middle portion;
    wherein the heat reservoir is U-shaped, and the upper portion is parallel to the lower portion; and
    wherein the upper portion defines a slot receiving the heat pipe.

14. The heat dissipating device of claim 13, wherein the heat sink is sandwiched between the upper portion and the lower portion of the heat reservoir.

* * * * *